(12) United States Patent
Yang

(10) Patent No.: US 7,960,213 B2
(45) Date of Patent: Jun. 14, 2011

(54) ELECTRONIC PACKAGE STRUCTURE AND METHOD

(75) Inventor: Yu-Lin Yang, Hsinchu County (TW)

(73) Assignee: Richtek Technology Corp., Hsinchu (TW)

( * ) Notice: Subject to any disclaimer, the term of this patent is extended or adjusted under 35 U.S.C. 154(b) by 0 days.

(21) Appl. No.: 12/693,712

(22) Filed: Jan. 26, 2010

(65) Prior Publication Data

US 2010/0129962 A1 May 27, 2010

Related U.S. Application Data

(62) Division of application No. 12/068,773, filed on Feb. 12, 2008.

(30) Foreign Application Priority Data

Feb. 16, 2007 (TW) .............................. 96106016 A

(51) Int. Cl.
*H01L 21/00* (2006.01)
*H01L 21/44* (2006.01)
(52) U.S. Cl. ..................... 438/110; 438/121; 438/597
(58) Field of Classification Search .................. None
See application file for complete search history.

(56) References Cited

U.S. PATENT DOCUMENTS

| 3,363,146 | A | * | 1/1968 | Dijkmeijer et al. | 361/784 |
|---|---|---|---|---|---|
| 3,387,365 | A | * | 6/1968 | Stelmak | 29/840 |
| 3,757,175 | A | * | 9/1973 | Kim et al. | 257/668 |
| 4,251,852 | A | * | 2/1981 | Ecker et al. | 361/718 |
| 4,512,509 | A | * | 4/1985 | Ellis et al. | 228/180.21 |
| 4,647,959 | A | * | 3/1987 | Smith | 257/668 |
| 4,744,008 | A | * | 5/1988 | Black et al. | 361/717 |
| 4,931,853 | A | * | 6/1990 | Ohuchi et al. | 257/679 |
| 5,048,179 | A | * | 9/1991 | Shindo et al. | 29/840 |
| 5,049,980 | A | * | 9/1991 | Saito et al. | 257/758 |
| 5,241,456 | A | * | 8/1993 | Marcinkiewicz et al. | 361/792 |
| 5,563,773 | A | * | 10/1996 | Katsumata | 361/764 |
| 5,712,197 | A | * | 1/1998 | Sanders et al. | 438/107 |
| 6,258,622 | B1 | * | 7/2001 | Lin et al. | 438/106 |
| 6,856,007 | B2 | * | 2/2005 | Warner | 257/678 |
| 7,834,464 | B2 | * | 11/2010 | Meyer et al. | 257/777 |
| 2003/0042591 | A1 | * | 3/2003 | Goller et al. | 257/686 |
| 2008/0128903 | A1 | * | 6/2008 | Okayama et al. | 257/737 |

* cited by examiner

*Primary Examiner* — Scott B Geyer
(74) *Attorney, Agent, or Firm* — Rosenberg, Klein & Lee

(57) ABSTRACT

An electronic package structure and method use a conductive strip to bond die-to-die, die-to-lead, chip carrier-to-lead, or lead-to-lead. A conductive strip may carry greater current than a bonding wire, and thus may replace several bonding wires. The bonding of the conductive strip may be carried out by an SMT process, and thus requires lower cost than wire bonding processes. A conductive strip may be bonded to more than two dice or leads to save more bonding wires. A conductive strip is stronger than a bonding wire, and thus lowers the possibility of being broken.

1 Claim, 4 Drawing Sheets

US 7,960,213 B2

ELECTRONIC PACKAGE STRUCTURE AND METHOD

RELATED APPLICATIONS

This application is a Divisional patent application of co-pending application Ser. No. 12/068,773, filed on 12 Feb. 2008. The entire disclosure of the prior application Ser. No. 12/068,773, from which an oath or declaration is supplied, is considered a part of the disclosure of the accompanying Divisional application and is hereby incorporated by reference.

FIELD OF THE INVENTION

The present invention is related generally to integrated circuit (IC) products and, more particularly, to an electronic package structure and method.

BACKGROUND OF THE INVENTION

In a typical semiconductor process, dice are cut from wafers by a dicing process, then each die is attached to a package substrate or a chip carrier of a leadframe, the inputs/outputs of the die are electrically connected to leads of the leadframe by a bonding process, and finally, plastic, ceramic or metal is used to encapsulate the die except that the outer leads of the leadframe are left exposed outside the package for connecting to other electronic components. This process is called electronic package method. With the protection of the electronic package, the IC components in the die may avoid damages from external environment or forces.

For an electronic package, there are three popular bonding processes, wire bonding, tape automatic bonding (TAB) and flip-chip bonding, among which the wire bonding is the most often used. The wire bonding process uses a bonder to bond one end of a wire to a bonding pad on a die and the other end to a lead of a leadframe. The commonly used wires include aluminum wires, gold wires, silver wires and so on. The thickness of a single wire or the number of wires will be proportional to the current to be carried. The greater the current to be carried, the larger the thickness of a single wire or the number of wires is. For instance, for power input and output of a power management chip, sometimes more than five bonding wires are bonded to a bonding pad of the chip because great current will flow therethrough. Such high current applications result in high cost and low yield packages. In some circumstances, for example, if non-uniform contact resistance is present between several wires bonded on a same bonding pad, or some of the bonding wires are broken, there will be a single one among the bonding wires carrying the high current and thus being broken.

SUMMARY OF THE INVENTION

An object of the present invention is to provide an electronic package structure for high current applications.

Another object of the present invention is to provide a stronger electronic package structure.

Still another object of the present invention is to provide a low-cost electronic package structure and method.

According to the present invention, an electronic package structure comprises a conductive strip to bond die-to-die, die-to-lead, chip carrier-to-lead, or lead-to-lead.

A conductive strip may carry greater current than a bonding wire, and thus may replace several bonding wires.

The bonding of the conductive strip may be carried out by a surface mounting technology (SMT). Preferably, the conductive strip is applied with a bonding material thereon and then bonded to a bump on a die. Alternatively, the bonding material is spotted or printed on a chip carrier and a lead, and then the conductive strip is bonded to the chip carrier and the lead. SMT process requires lower cost than wire bonding processes.

A conductive strip may be bonded to more than two dice or leads to save more bonding wires.

A conductive strip is stronger than a bonding wire, and thus lowers the possibility of being broken.

A conductive strip may easily replace bonding wires to carry greater current no matter in single-chip packages and multi-chip packages.

The inventive method can be used together with conventional wire bonding processes, in which convention bonding wires are for small current conducting, and conductive strips are for greater current conducting.

DETAILED DESCRIPTION OF THE INVENTION

Figure 1:
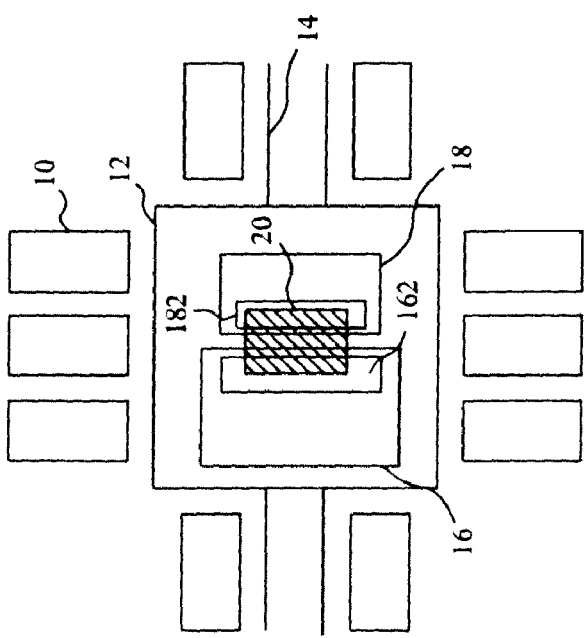
FIG. 1 shows a first embodiment according to the present invention.

FIG. 1 shows a first embodiment according to the present invention, which uses a conductive strip for a multi-chip package. Dice 16 and 18 are attached on two portions of a chip carrier 12, a supporting frame 14 supports the chip carrier 12, and a plurality of leads 10 surrounds the chip carrier 12. Bonding pads 162 and 182 are on the dice 16 and 18 and electrically connected to the circuits in the dice 16 and 18, respectively. A conductive strip 20 is bonded to the bonding pads 162 and 182 and thus electrically connects the dice 16 and 18 to each other.

Figure 2:
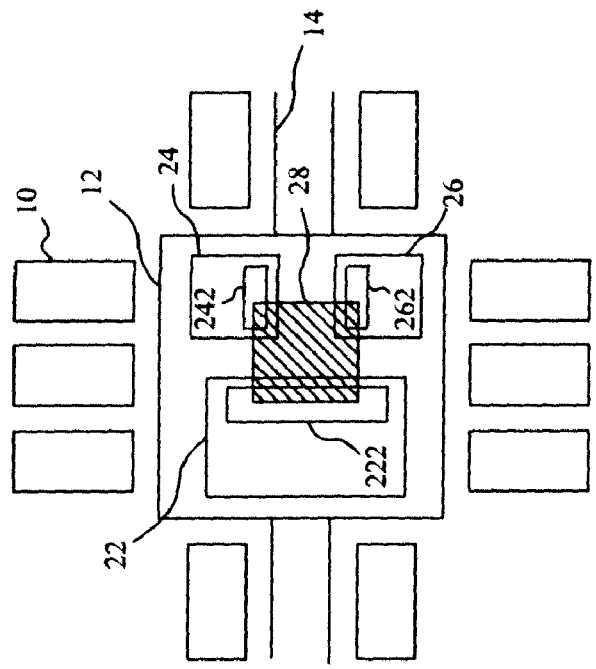
FIG. 2 shows a second embodiment according to the present invention.

FIG. 2 shows a second embodiment according to the present invention, in which dice 22, 24 and 26 are attached on three portions of a chip carrier 12 and have bonding pads 222, 242 and 262 thereon, respectively, and a conductive strip 28 is bonded to the bonding pads 222, 242 and 262 to electrically connect the dice 22, 24 and 26 to each other.

Figure 3:
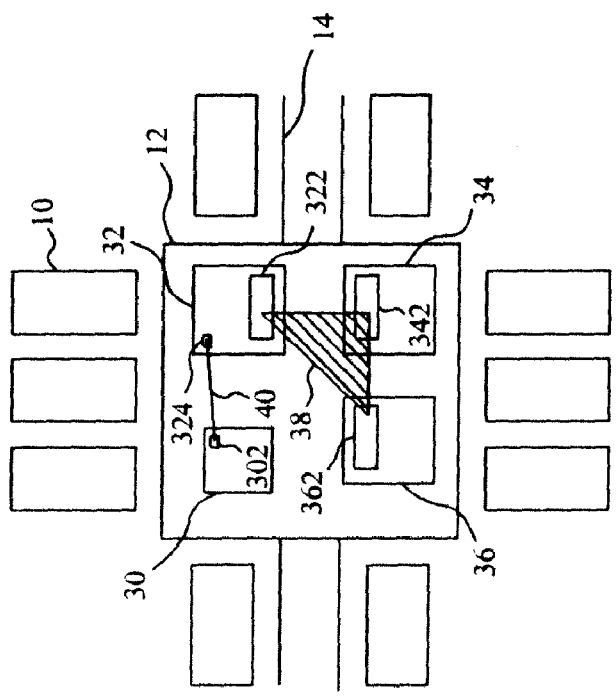
FIG. 3 shows a third embodiment according to the present invention.

FIG. 3 shows a third embodiment according to the present invention, which uses a bonding wire and a conductive strip for an electronic package. A chip carrier 12 carries dice 30, 32, 34 and 36 on its four portions respectively, and a conductive strip 38 is bonded to the bonding pads 322, 342 and 362 on the dice 32, 34 and 36 respectively. The conductive strip 38 is of a triangle shape to avoid the die 30. A bonding wire 40 is bonded by a conventional wire bonding process to the bonding pad 302 of the die 30 and the bonding pad 324 of the die 32.

Figure 4:
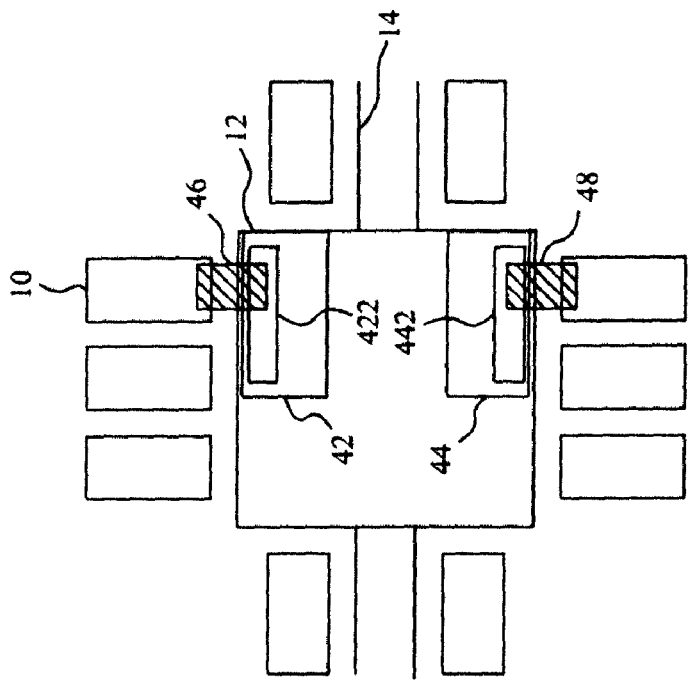
FIG. 4 shows a fourth embodiment according to the present invention.

FIG. 4 shows a fourth embodiment according to the present invention, which has dice 42 and 44 attached on a chip carrier 12 of a leadframe, a conductive strip 46 bonded to a lead 10 of the leadframe and a bonding pad 422 on the die 42, and another conductive strip 48 bonded to a bonding pad 442 on the die 44 and another lead 48 of the leadframe.

Figure 5:
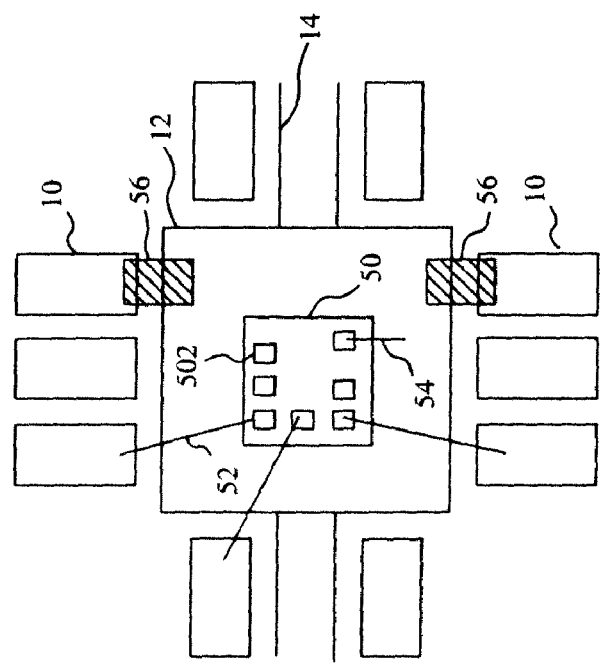
FIG. 5 shows a fifth embodiment according to the present invention.

FIG. 5 shows a fifth embodiment according to the present invention, which uses conductive strips for a single-chip package. A die 50 is attached on a chip carrier 12 of a leadframe, a bonding wire 52 is bonded to a bonding pad 502 on the die 50 and a lead 10 of the leadframe, a bonding wire 54 is bonded to another bonding pad 502 on the die 50 and the chip carrier 12, and a conductive strip 56 is bonded to another lead 10 of the leadframe and the chip carrier 12.

Figure 6:
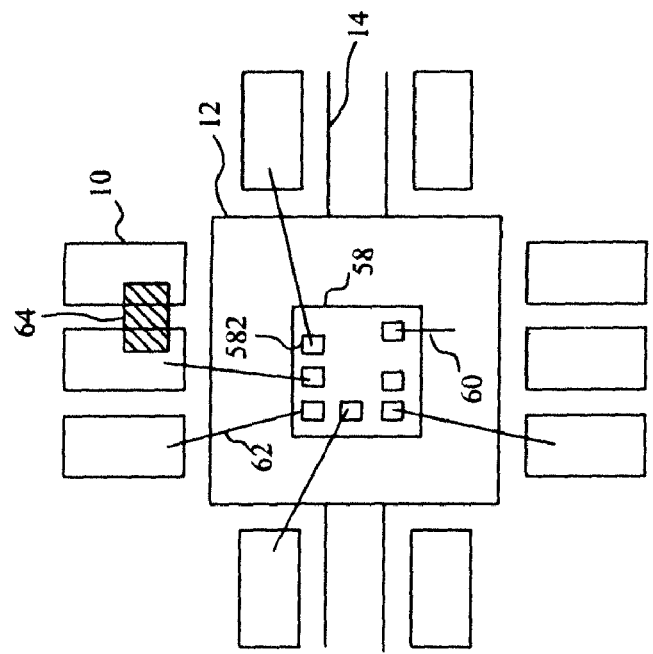
FIG. 6 shows a sixth embodiment according to the present invention.

FIG. 6 shows a sixth embodiment according to the present invention, in which a bonding wire 62 is bonded to a bonding pad 582 on a die 58 and a lead 10 of a leadframe, another bonding wire 60 is bonded to another bonding pad 582 on the die 58 and a chip carrier 12 of the leadframe, and a conductive strip 64 is bonded to two neighboring leads 10 of the leadframe.

The portions of a chip carrier for dice to be attached thereon may be electrically connected to each other, for example in the case of a metal chip carrier; or they may be electrically insulated from each other, for example in the case of a ceramic or plastic chip carrier.

As shown in the above embodiments, a conductive strip for electronic package structure and method according to the present invention may have various sizes and shapes based on their applications and may be bonded to several dice. In addition, in the above embodiments, although it is shown that the dice to be bonded by a conductive strip in an electronic package structure and method according to the present invention are attached on a same chip carrier, dice attached on different chip carriers may be bonded by a conductive strip in some applications according to the present invention.

Preferably, the conductive strip used in an electronic package structure and method according to the present invention is a metal, such as copper, silver and lead.

Figure 7:
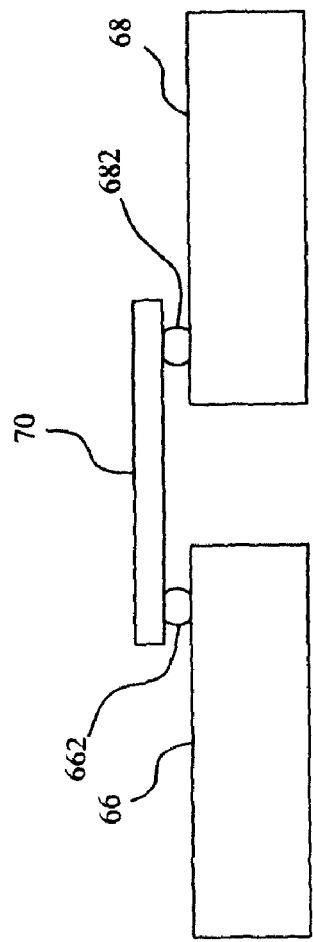
FIG. 7 is a schematic view showing a conductive strip bonded to two dice.

FIG. 7 is a schematic view showing a conductive strip bonded to two dice in an electronic package method according to the present invention. In a typical SMT process, solder paste is generally used as a bonding material, and screen printing, needle spotting or dispensing is used to apply the bonding material to predetermined locations. The components to be bonded are disposed on the solder paste at those locations, and then heat treatment or UV light is applied to harden the solder paste so as to bond the components. In this embodiment, bumps 662 and 682 are grown on dice 66 and 68 in advance. Bonding material such as solder paste is applied on a conductive strip 70, and then the conductive strip 70 is disposed on the bumps 662 and 682 with the bonding material therebetween. After heat treatment, the bonding material, the conductive strip 70 and the bumps 662 and 682 are eutectically solidified, and thus the conductive strip 70 and the bumps 662 and 682 are bonded together.

Figure 8:
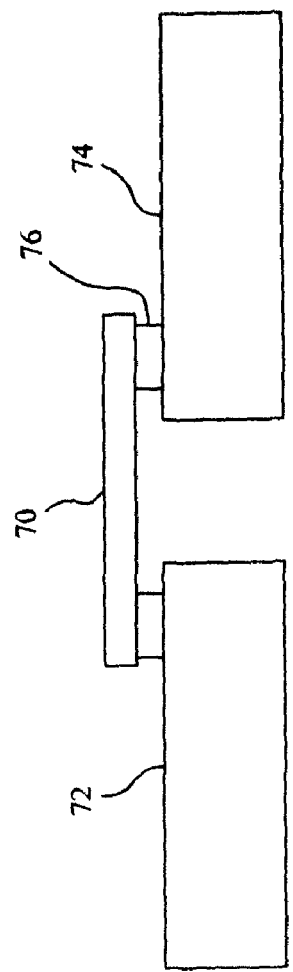
FIG. 8 is a schematic view showing a conductive strip bonded to a lead and a chip carrier.

FIG. 8 is a schematic view showing a conductive strip bonded to a lead and a chip carrier in an electronic package method according to the present invention. Bonding material 76 is applied on a lead 72 and a chip carrier 74 at predetermined locations by spotting or dispensing, and then the conductive strip 70 is disposed on the lead 72 and the chip carrier 74 with the bonding material 76 therebetween. After heat treatment, the bonding material, the conductive strip 70, the lead 72 and the chip carrier 74 are eutectically solidified. In addition, printing may be used instead, to apply the bonding material 76 on the predetermined locations. The bonding material 76 may be other than solder, for example conductive glue or silver glue.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An electronic packaging method comprising the steps of:
providing a plurality of dice disposed on a common chip carrier, each die having a bonding pad thereon;
spanning a conductive strip formed of a metal sheet across the bonding pads of at least two of the plurality of dice; and
bonding the metal sheet to the bonding pads, at least one of the bonding pads having a bump thereon and the metal sheet being bonded thereto, the bonding of the metal sheet to the bonding pads including:
applying a bonding material on the metal sheet or on the bonding pads;
disposing the metal sheet on the bonding pads with the bonding material therebetween; and
heat treatment for bonding the metal sheet to the bonding pads with the bonding material.

* * * * *